US010665423B2

(12) United States Patent
Preikszas

(10) Patent No.: US 10,665,423 B2
(45) Date of Patent: May 26, 2020

(54) ANALYZING ENERGY OF CHARGED PARTICLES

(71) Applicant: Carl Zeiss Microscopy GmbH, Jena (DE)

(72) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 15/183,061

(22) Filed: Jun. 15, 2016

(65) Prior Publication Data
US 2016/0365221 A1    Dec. 15, 2016

(30) Foreign Application Priority Data

Jun. 15, 2015   (DE) .................. 10 2015 210 893

(51) Int. Cl.
*H01J 37/244* (2006.01)
*H01J 37/28* (2006.01)
(Continued)

(52) U.S. Cl.
CPC .............. *H01J 37/28* (2013.01); *H01J 37/10* (2013.01); *H01J 37/1475* (2013.01);
(Continued)

(58) Field of Classification Search
CPC .. H01J 37/05; H01J 49/488; H01J 2237/2448; H01J 2237/24485;
(Continued)

(56) References Cited

U.S. PATENT DOCUMENTS 3,731,096 A * 5/1973 Carter ................... H01J 49/488
                                                        250/305
3,935,454 A * 1/1976 Lee ....................... H01J 49/488
                                                        250/305
(Continued)

FOREIGN PATENT DOCUMENTS

DE    36 38 682 A1    5/1988
DE   199 29 185 A1    1/2001
(Continued)

OTHER PUBLICATIONS

Hafner, Bob. "Scanning electron microscopy primer." Characterization Facility, University of Minnesota-Twin Cities(2007): 1-29.*
(Continued)

*Primary Examiner* — Wyatt A Stoffa
(74) *Attorney, Agent, or Firm* — Muirhead and Saturelli, LLC

(57) ABSTRACT

An analysis device, possibly having an electrostatic and/or magnetic lens, analyzes the energy of charged particles and has an opposing field grid device to which a voltage is applied in such a way that a portion of the charged particles is reflected by the opposing field grid device. Another portion of the charged particles passes through the opposing field grid device and is detected by a detector. The opposing field grid device has a curvature. A center of curvature is an intersection point of an optical axis with the opposing field grid device. The curvature has a radius of curvature which is given by the section between the center of curvature and a starting point on the optical axis. The opposing field grid device is curved in the direction of the starting point as viewed from the center of curvature and/or is arranged to be displaceable along the optical axis.

17 Claims, 8 Drawing Sheets

(51) Int. Cl.
   *H01J 37/10* (2006.01)
   *H01J 37/147* (2006.01)
   *H01J 37/21* (2006.01)
(52) U.S. Cl.
   CPC ............ *H01J 37/21* (2013.01); *H01J 37/244* (2013.01); *H01J 2237/05* (2013.01); *H01J 2237/2449* (2013.01); *H01J 2237/24475* (2013.01); *H01J 2237/24485* (2013.01)
(58) Field of Classification Search
   CPC ....... H01J 2237/057; H01J 2237/04756; H01J 2237/053; H01J 2237/0475; H01J 37/28; H01J 37/21; H01J 37/244
   See application file for complete search history.

(56) References Cited

U.S. PATENT DOCUMENTS

| | | | | |
|---|---|---|---|---|
| 4,355,232 A | * | 10/1982 | Todokoro | G01R 31/305 250/310 |
| 4,808,821 A | * | 2/1989 | Feuerbaum | G01R 31/305 250/305 |
| 4,812,651 A | * | 3/1989 | Feuerbaum | H01J 37/14 250/305 |
| 4,922,097 A | * | 5/1990 | Todokoro | G01R 31/305 250/310 |
| 4,962,306 A | * | 10/1990 | Hodgson | H01J 37/244 250/305 |
| 5,408,098 A | * | 4/1995 | Wells | H01J 37/244 250/305 |
| 6,492,644 B1 | | 12/2002 | Staib | |
| 8,203,119 B2 | * | 6/2012 | Degenhardt | H01J 37/244 250/296 |
| 2004/0036031 A1 | | 2/2004 | Rose et al. | |
| 2004/0245465 A1 | | 12/2004 | Steigerwald et al. | |
| 2006/0113474 A1 | * | 6/2006 | Todokoro | G01N 23/225 250/310 |
| 2006/0278826 A1 | * | 12/2006 | Roberts | H01J 37/222 250/310 |
| 2006/0289748 A1 | * | 12/2006 | Schon | H01J 43/24 250/306 |
| 2007/0200070 A1 | * | 8/2007 | Tromp | H01J 37/05 250/396 R |
| 2008/0099674 A1 | * | 5/2008 | Bihr | G03F 1/72 250/307 |
| 2009/0309024 A1 | * | 12/2009 | Steigerwald | H01J 37/244 250/310 |
| 2010/0163725 A1 | * | 7/2010 | Barkshire | H01J 37/05 250/305 |
| 2011/0001056 A1 | * | 1/2011 | Stresau | H01J 37/147 250/396 R |
| 2011/0220793 A1 | * | 9/2011 | Thomas | H01J 37/20 250/307 |
| 2014/0124666 A1 | * | 5/2014 | Sasaki | H01J 37/05 250/310 |
| 2014/0284476 A1 | | 9/2014 | Ren et al. | |
| 2014/0306110 A1 | | 10/2014 | Schubert | |
| 2016/0372304 A1 | * | 12/2016 | Masnaghetti | H01J 37/244 |

FOREIGN PATENT DOCUMENTS

| | | |
|---|---|---|
| DE | 10 2006 043 895 A1 | 3/2008 |
| DE | 10 2013 006 535 A1 | 10/2014 |
| EP | 1 388 882 A2 | 2/2004 |
| EP | 1 362 361 B1 | 4/2008 |
| EP | 1 439 565 B1 | 8/2012 |
| WO | WO 2002/067286 A2 | 8/2002 |
| WO | WO 2008/087384 A2 | 7/2008 |
| WO | WO 2008/087386 A1 | 7/2008 |

OTHER PUBLICATIONS

Michael Steigerwald, "A Mirror-Corrected Scanning Electron Microscope," Ultimate Low-kV Resolution and New Analysis Capabilities, Carl Zeiss Microscopy, Mar. 26, 2013.

V. Romanovsky, et al., "Fully Electrostatic Low Energy Scanning Electron Column," Recent Trends in Charged Particle Optics and Surface Physics Instrumentation, pp. 33-34, Proceedings of the 8$^{th}$ International Seminar Recent Trends in Charged Particle Optics and Surface Physics Instrumentation, 2002.

* cited by examiner

ANALYZING ENERGY OF CHARGED PARTICLES

TECHNICAL FIELD

This application relates to an analysis device for analyzing the energy of charged particles and to a particle beam apparatus including such an analysis device and more particularly to an electron beam apparatus and/or an ion beam apparatus for analyzing the energy of charged particles.

BACKGROUND

Electron beam apparatuses, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and focused on an object to be examined by way of a beam guiding system. An objective lens is used for focusing purposes. The primary electron beam is guided in a raster manner over a surface of the object to be examined by way of a deflection device. Here, the electrons of the primary electron beam interact with the object to be examined. Interaction particles in particular are produced as a result of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary beam and are detected by at least one particle detector. The particle detector generates detection signals which are used for generating an image of the object. An image of the object to be examined is thus obtained.

In the case of a TEM, a primary electron beam is likewise generated by means of a beam generator and focused on an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also comprises a projection lens. Here, imaging can also take place in the scanning mode of a TEM. Such a TEM is generally referred to as STEM. Additionally, provision can be made for detecting electrons scattered back at the object to be examined and/or secondary electrons emitted by the object to be examined by means of a further detector in order to image an object to be examined.

The integration of the function of an STEM and an SEM in a single particle beam apparatus is known. It is therefore possible to carry out examinations of objects with an SEM function and/or with an STEM function using this particle beam apparatus.

Furthermore, the prior art teaches the practice of analyzing and/or processing an object in a particle beam apparatus using, on the one hand, electrons and, on the other hand, ions. By way of example, an electron beam column having the function of an SEM is arranged at the particle beam apparatus. Additionally, an ion beam column is arranged at the particle beam apparatus. Ions used for processing an object are generated by means of an ion beam generator arranged in the ion beam column. By way of example, material of the object is ablated or material is applied onto the object during the processing. The ions are additionally or alternatively used for imaging. The electron beam column with the SEM function serves, in particular, for examining further the processed or unprocessed object, but also for processing the object.

In a further known particle beam apparatus, from the abovementioned secondary beam a large portion of the secondary particles is separated from the backscattered particles. By way of example, a large portion of the secondary electrons is blocked out from the secondary beam. Almost only backscattered electrons then reach the detector. Said backscattered electrons are detected by the detector. Detection signals are generated which are used for imaging purposes. The known particle beam apparatus has an opposing field grid arranged between the object and the detector. A voltage is applied to the opposing field grid in such a way that a large portion of the secondary electrons is reflected by the opposing field grid and not detected by the detector.

The abovementioned opposing field grid is also used to determine the energy of the interaction particles. As already mentioned above, a voltage is applied to the opposing field grid in such a way that a large portion of the secondary particles, for example of the secondary electrons, is reflected by the opposing field grid and not detected by the detector. The voltage determines a threshold energy. Interaction particles having an energy that is greater than the threshold energy predefined by the opposing field grid reach the detector and are detected. It is thus possible to make a statement to the effect that the detected interaction particles have an energy that is greater than the threshold energy.

In a further known particle beam apparatus, provision is made for arranging, in addition to the opposing field grid mentioned above, an electrostatic aperture between the opposing field grid and the detector. By applying a voltage to the electrostatic aperture, an electric field is generated in such a way that only interaction particles which have the threshold energy or substantially have the threshold energy impinge on the detector.

It is furthermore known to design the opposing field grid in a curved fashion. A spherical opposing field is generated by means of this opposing field grid and makes it possible that interaction particles which pass both near to and far from an optical axis of the particle beam apparatus and which pass from a point on the optical axis and form a divergent beam pass through the opposing field grid and reach the detector if the interaction particles have at least the threshold energy.

In yet another known particle beam apparatus, provision is made for arranging, as viewed in a direction opposite to the direction of incidence of the interaction particles on the detector, firstly an opposing field grid and then a magnetic or electrostatic lens. This makes it possible to cause a divergent bundle of the beam of interaction particles to enter the opposing field of the opposing field grid in a parallel fashion.

With regard to the prior art, reference is made to EP 1 439 565 B1, US 2014/0284476 A1, DE 199 29 185 A1, WO 2008/087384 A2 and WO 2008/087386 A1.

The bundle of the beam of interaction particles, for example the secondary beam mentioned above, may be very large. By way of example, the bundle of the secondary beam may have a divergence angle of approximately ±40 mrad.

This means that some of the interaction particles of the secondary beam pass near to the optical axis of the particle beam apparatus. Still other interaction particles of the secondary beam pass far from the optical axis. In the particle beam apparatus having both the abovementioned magnetic or electrostatic lens and the abovementioned opposing field grid, the interaction particles that pass near to the optical axis pass parallel to the optical axis to a good approximation after passing through the magnetic or electrostatic lens. However, interaction particles that pass far from the optical axis, after passing through the magnetic or electrostatic lens, do not pass parallel to the optical axis, but rather in the direction of the optical axis, on account of an aperture aberration of the magnetic or electrostatic lens. This may lead to errors in the detection of the interaction particles. It is possible that not all the interaction particles which actually have the threshold energy reach the detector.

The abovementioned problem may be solved if the opposing field grid arranged between the detector and the magnetic or electrostatic lens is curved in such a way that the starting point of the radius of curvature corresponds to a crossover of the secondary beam on the optical axis. An explanation is given below of what is understood by the terms starting point and crossover. The starting point is a point on the optical axis passing through the opposing field grid. An intersection point of the optical axis with the opposing field grid is a center of curvature of the curvature. The radius of curvature of the curvature corresponds to the section between the center of curvature and the starting point. A crossover is understood to be a position on an axis, for example the optical axis of a particle beam apparatus, at which particles, for example the electrons of the primary electron beam or particles of the secondary beam, converge and a cross-sectional area of the beam, for example of the primary electron beam or of the secondary beam, has a local minimum.

It may then happen that the crossover of the secondary beam of interaction particles travels along the optical axis on account of changed imaging properties of the particle beam apparatus. Since the curvature of the known opposing field grid cannot be changed or can be changed only with very great difficulty, an adaptation to the altered position of the crossover is not possible or is possible only with very great difficulty, such that the interaction particles passing on paths far from the optical axis possibly do not reach the detector.

Accordingly, it is desirable to be able to specify a simplified analysis device for analyzing the energy of charged particles and a particle beam apparatus comprising such an analysis device in which a displacement of a crossover of the secondary beam of interaction particles along an optical axis can be compensated for.

SUMMARY OF THE INVENTION

The analysis device according to the system described herein is provided for analyzing the energy of charged particles, in particular interaction particles. By way of example, the charged particles are secondary particles in the form of secondary electrons or secondary ions. In further embodiments, the interaction particles additionally or alternatively comprise backscattered particles, for example backscattered electrons. The analysis device according to the system described herein has at least one detector for detecting the charged particles. The detector is provided with a detection area on which impinge the charged particles which move in a direction of incidence toward the detector. By way of example, the charged particles move along an optical axis in the direction of incidence toward the detector.

The analysis device according to the system described herein furthermore has at least one opposing field grid device to which a voltage is applied in such a way that a portion of the charged particles is reflected by the opposing field grid device and not detected by the detector. A further portion of the charged particles, which has an energy above or equal to a threshold energy predefined by the voltage, is not reflected, may pass through the opposing field grid device and is guided to the detector.

Furthermore, the analysis device according to the system described herein has at least one electrostatic and/or magnetic lens, wherein proceeding from the detector, as viewed in a direction opposite to the direction of incidence of the charged particles, firstly the detector, then the opposing field grid device and then the electrostatic and/or magnetic lens are arranged. To put it another way, the abovementioned units proceeding from the detector, as viewed in the direction opposite to the direction of incidence of the charged particles, are arranged in the following order: the detector—the opposing field grid device—the electrostatic and/or magnetic lens.

The opposing field grid device has a curvature. Furthermore, the optical axis already mentioned above extends through the opposing field grid device. The opposing field grid device has a center of curvature which is an intersection point of the optical axis with the opposing field grid device. The curvature has a radius of curvature which is given by the section between the center of curvature and a starting point on the optical axis. The opposing field grid device is curved in the direction of the starting point as viewed from the center of curvature. Furthermore, one of the following features is provided in the analysis device according to the system described herein:

- the electrostatic and/or magnetic lens is arranged along the optical axis downstream of the starting point as viewed in the direction of incidence of the charged particles;
- the starting point is arranged along the optical axis between the electrostatic and/or magnetic lens and the center of curvature; or
- the starting point is arranged along the optical axis downstream of the electrostatic and/or magnetic lens and downstream of the center of curvature as viewed in the direction of incidence of the charged particles.

If the position of the crossover on the optical axis changes (for example as a result of a change in imaging properties of a particle beam apparatus in which the analysis device according to the system described herein is arranged), then it is possible to compensate for the displacement of the crossover by means of an excitation of the electrostatic and/or magnetic lens that is adapted to said displacement. The electrostatic and/or magnetic lens is always excited in such a way that, on the one hand, the charged particles which move near the optical axis are further guided near to the optical axis and along the optical axis. On the other hand, the charged particles which pass far from the optical axis are guided in a direction toward the optical axis. Upon passing through the opposing field grid device, both charged particles having an energy higher than the threshold energy which pass near the optical axis and charged particles having an energy higher than the threshold energy which pass far from the optical axis then pass through the opposing field generated in the opposing field grid device parallel or substantially parallel to the opposing field and impinge on the detection area of the detector. The excitation of the electrostatic and/or magnetic lens is so low that an aperture aberration of the electrostatic and/or magnetic lens has hardly any influence on the charged particles passing through the electrostatic and/or magnetic lens. Furthermore, the system described herein affords the possibility of defining the length of the section between the starting point and the electrostatic and/or magnetic lens by means of an initial choice of the curvature of the opposing field grid device. Accordingly, the curvature may initially be chosen in such a way that the various possible positions of the crossover may be taken into account which may arise for example for different imaging properties of a particle beam apparatus in which the analysis device according to the system described herein is arranged.

In a further configuration of the analysis device according to the system described herein, it is additionally or alternatively provided that the analysis device has one of the following features:

- a crossover of the charged particles is arranged on the optical axis downstream of the starting point and upstream of the electrostatic and/or magnetic lens as viewed in the direction of incidence of the charged particles;
- a crossover of the charged particles is arranged upstream of the electrostatic and/or magnetic lens as viewed in the direction of incidence of the charged particles, wherein the electrostatic and/or magnetic lens is arranged upstream of the starting point as viewed in the direction of incidence of the charged particles; or
- a crossover of the charged particles is arranged downstream of the starting point as viewed in the direction of incidence of the charged particles, wherein the starting point is arranged downstream of the electrostatic and/or magnetic lens as viewed in the direction of incidence of the charged particles.

In the arrangement of the crossover downstream of the electrostatic and/or magnetic lens as viewed in the direction of incidence of the charged particles, the crossover is designed as a virtual crossover. In the further arrangements mentioned above, the crossover is designed as a real crossover.

In one configuration of the analysis device according to the system described herein, it is additionally or alternatively provided that the direction of incidence of the charged particles is aligned parallel to the optical axis.

In a further configuration of the analysis device according to the system described herein, it is additionally or alternatively provided that the opposing field grid device is designed in a spherical fashion. It is additionally or alternatively provided that the opposing field grid device is designed as a sphere segment.

In yet another configuration of the analysis device according to the system described herein, it is additionally or alternatively provided that the curvature is curved in the direction of the direction of incidence of the charged particles. As an alternative thereto, it is provided that the curvature is curved in a direction opposite to the direction of incidence of the charged particles. The last-mentioned embodiment is provided particularly if the crossover is arranged on the optical axis between the starting point and the electrostatic and/or magnetic lens, namely, as viewed in the direction of incidence of the charged particles, in the order starting point—crossover—electrostatic and/or magnetic lens. Furthermore, the last-mentioned embodiment is also provided if, as viewed in the direction of incidence of the charged particles, the following order is provided: electrostatic and/or magnetic lens—starting point—center of curvature, wherein the starting point is arranged upstream of the crossover, as viewed in the direction of incidence of the charged particles. The last-mentioned embodiment is also provided, in particular, if the crossover is arranged upstream of the electrostatic and/or magnetic lens as viewed in the direction of incidence of the charged particles, wherein in this embodiment the starting point is arranged between the electrostatic and/or magnetic lens and the center of curvature.

In one embodiment of the analysis device according to the system described herein, it is additionally or alternatively provided that the opposing field grid device has at least one first grid and at least one second grid. By way of example, it is provided that the first grid and the second grid are curved in each case. Furthermore, it is provided, for example, that the first grid and the second grid have a constant distance relative to one another. To put it more precisely, it is provided that the first grid and the second grid are concentric, that is to say that a first curvature of the first grid and a second curvature of the second grid have an identical starting point. Distance denotes the section which, proceeding from a first point on one of the two grid (that is to say of the first grid and of the second grid) has the shortest length to a second point on the other of the two grids.

It has been found that the crossover of the charged particles may be situated at different positions of the optical axis in an x-section along an x-axis and a y-section along a y-axis, wherein the optical axis is a z-axis and wherein the x-axis, the y-axis and the z-axis are aligned perpendicular to one another. In order to compensate for this, a further embodiment of the analysis device according to the system described herein provides for using a stigmator. In this regard, the analysis device has for example at least one stigmator, wherein proceeding from the detector, as viewed in a direction opposite to the direction of incidence of the charged particles, firstly the electrostatic and/or magnetic lens and then the stigmator are arranged. In addition, it is provided, for example, that the electrostatic and/or magnetic lens has a minimum focal length. The distance between the stigmator and the electrostatic and/or magnetic lens corresponds for example maximally to the minimum focal length. However, the position of the stigmator in the analysis device according to the system described herein is not restricted to the abovementioned arrangement. Rather, in a further embodiment of the analysis device according to the system described herein, provision is made, proceeding from the detector, as viewed in a direction opposite to the direction of incidence of the charged particles, for arranging firstly the at least one stigmator and then the electrostatic and/or magnetic lens. Here, too, it is additionally provided, for example, that the distance between the stigmator and the electrostatic and/or magnetic lens corresponds maximally to the minimum focal length of the electrostatic and/or magnetic lens. In yet another exemplary embodiment, it is alternatively provided that the stigmator is designed with the electrostatic and/or magnetic lens as an individual particle-optical unit. By way of example, said particle-optical unit is designed as an electrostatic lens having one electrode or having a plurality of electrodes, which may be magnetic or nonmagnetic. The electrode or the plurality of electrodes are segmented and have a plurality of segments. The individual segments are provided with additional windings or different voltages may be applied to said individual segments in such a way that the latter may have the function of the electrostatic lens, on the one hand, and the function of the stigmator, on the other hand. In the case of a magnetic lens, it is provided, for example, that pole pieces of the magnetic lens are segmented and are provided with additional windings or different voltages may be applied to said pole pieces in order to realize the two functions mentioned above. In yet another exemplary embodiment of the analysis device according to the system described herein, it is additionally or alternatively provided that the stigmator is designed as air-core coil(s). In a further exemplary embodiment of the analysis device according to the system described herein, it is additionally or alternatively provided that the stigmator is of magnetic or electrostatic design.

In a further embodiment of the analysis device according to the system described herein, the analysis device has a control device for controlling the excitation of the electrostatic and/or magnetic lens, wherein the control device is configured in such a way that the excitation of the electrostatic and/or magnetic lens is controlled depending on the voltage applied to the opposing field grid device. To put it another way, the excitation of the electrostatic and/or magnetic lens is controlled depending on the threshold energy. This has the following background. The beam of the charged particles contains particles having different energies. Accordingly, it is almost essential that the crossovers of said charged particles be arranged at different locations along the optical axis. If the analysis device is used in a particle beam apparatus with a beam splitter, then despite an optimization of the beam splitter wherein the charge particles leave the beam splitter near the optical axis of the analysis device, it may be the case that a small lateral offset of the crossover with respect to the optical axis of the analysis device occurs depending on the energy of the charged particles. For a good energy resolution it is desirable if the charged particles having an energy near the threshold energy have their crossover at the starting point. For this reason, in the exemplary embodiment described here, provision is made, for example, for controlling the excitation of the electrostatic and/or magnetic lens depending on the voltage applied to the opposing field grid device in such a way that the crossover of said charged particles is arranged at the starting point. Further exemplary embodiments are specified further below.

The system described herein also relates to a further analysis device for analyzing the energy of charged particles, in particular interaction particles. The interaction particles are, for example, the interaction particles already mentioned further above. The further analysis device according to the system described herein has at least one optical axis and at least one detector for detecting the charged particles. The detector is provided with a detection area on which impinge the charged particles which move in a direction of incidence toward the detector. Furthermore, the further analysis device has at least one opposing field grid device to which a voltage is applied in such a way that a portion of the charged particles is reflected by the opposing field grid device and not detected by the detector. A further portion of the charged particles, which has an energy above or equal to a threshold energy predefined by the voltage, is not reflected and may pass through the opposing field grid device and is guided to the detector. The opposing field grid device has a curvature. Furthermore, the opposing field grid device is designed such that it is displaceable along the optical axis.

The further analysis device according to the system described herein has the same effects that have already been explained further above on account of the displaceable opposing field grid device. It is possible to compensate for different positions of the crossover by displacing the opposing field grid device in such a way that interaction particles near the axis and far from the axis which have at least the threshold energy may pass through the opposing field grid device.

In one embodiment of the further analysis device according to the system described herein, it is additionally or alternatively provided that the analysis device has at least one drive unit for moving the opposing field grid device along the optical axis.

In yet another embodiment of the further analysis device according to the system described herein, it is provided that the drive unit is configured in such a way that the movement of the opposing field grid device is controlled depending on the voltage applied to the opposing field grid device. To put it another way, the opposing field grid device is moved depending on the threshold energy. In this way, it is possible to place a crossover of charged particles having an energy near the threshold energy for example at a starting point A from which the radius of curvature of the curvature of the opposing field grid device proceeds to a center of curvature of the opposing field grid device. With regard to the terms radius of curvature and center of curvature, reference is made to the text further above and further below.

In one embodiment of the further analysis device according to the system described herein, it is additionally or alternatively provided that the direction of incidence of the charged particles is aligned parallel to the optical axis.

In yet another embodiment of the further analysis device according to the system described herein, it is additionally or alternatively provided that the optical axis extends through the opposing field grid device. Furthermore, the opposing field grid device has at least one center of curvature, wherein the center of curvature is an intersection point of the optical axis with the opposing field grid device. The curvature of the opposing field grid device has a radius of curvature which is given by the section between the center of curvature and a starting point on the optical axis.

In a configuration of the further analysis device according to the system described herein, it is additionally or alternatively provided that the opposing field grid device is designed in a spherical fashion. It is additionally or alternatively provided that the opposing field grid device is designed as a sphere segment.

In yet another configuration of the further analysis device according to the system described herein, it is additionally or alternatively provided that the curvature is curved in the direction of the direction of incidence of the charged particles. As an alternative thereto, it is provided that the curvature is curved in a direction opposite to the direction of incidence of the charged particles. The last-mentioned embodiment is provided particularly if the crossover is arranged on the optical axis between the starting point and the electrostatic and/or magnetic lens, namely, as viewed in the direction of incidence of the charged particles, in the order starting point—crossover—electrostatic and/or magnetic lens. Furthermore, the last-mentioned embodiment is also provided if, as viewed in the direction of incidence of the charged particles, the following order is provided: electrostatic and/or magnetic lens—starting point—center of curvature, wherein the starting point is arranged upstream of the crossover, as viewed in the direction of incidence of the charged particles. The last-mentioned embodiment is also provided, in particular, if the crossover is arranged upstream of the electrostatic and/or magnetic lens as viewed in the direction of incidence of the charged particles, wherein in this embodiment the starting point is arranged between the electrostatic and/or magnetic lens and the center of curvature.

In one embodiment of the further analysis device according to the system described herein, it is additionally or alternatively provided that the opposing field grid device has at least one first grid and at least one second grid. By way of example, it is provided that the first grid and the second grid are curved in each case. Furthermore, it is provided, for example, that the first grid and the second grid have a constant distance relative to one another. To put it more precisely, it is provided that the first grid and the second grid are concentric, that is to say that a first curvature of the first grid and a second curvature of the second grid have an identical starting point. Distance denotes the section which, proceeding from a first point on one of the two grids (that is to say of the first grid and of the second grid) has the shortest length to a second point on the other of the two grids.

In one embodiment of the further analysis device according to the system described herein, it is additionally or alternatively provided that the further analysis device has at least one stigmator. Proceeding from the detector, as viewed in a direction opposite to the direction of incidence of the charged particles, firstly the detector and then the stigmator are arranged. In particular, it is provided that the stigmator is of magnetic or electrostatic design.

The system described herein also relates to a particle beam apparatus for analyzing and/or processing an object. The particle beam apparatus according to the system described herein has at least one beam generator for generating a particle beam comprising charged primary particles. By way of example, the primary particles are electrons or ions. Furthermore, the particle beam apparatus according to the system described herein has at least one objective lens for focusing the particle beam onto the object. In an interaction of the particle beam with the object, interaction particles arise, for example secondary particles in the form of secondary electrons and/or secondary ions or backscattered particles in the form of backscattered electrons. Furthermore, the particle beam apparatus according to the system described herein is provided with at least one analysis device for analyzing the energy of charged particles in the form of the interaction particles, wherein the analysis device has at least one of the features mentioned above or further below or a combination of at least two of the features mentioned above or further below.

In one exemplary embodiment of the particle beam apparatus according to the system described herein, the particle beam apparatus has one of the following features:
- at least one beam deflection and/or beam shaping device;
- at least one beam deflection and/or beam shaping device comprising at least one magnetic sector for deflecting the particle beam;
- at least one beam deflection and/or beam shaping device and at least one control unit for controlling the beam deflection and/or beam shaping device, wherein the control unit is configured in such a way that the beam deflection and/or beam shaping device is controlled depending on the voltage applied to the opposing field grid device; or
- at least one beam deflection and/or beam shaping device comprising at least one magnetic sector for deflecting the particle beam and comprising at least one control unit for controlling the magnetic sector, wherein the control unit is configured in such a way that the magnetic sector is controlled depending on the voltage applied to the opposing field grating device.

With regard to the advantages for the control depending on the applied voltage, reference is made to the text further above.

In a further exemplary embodiment, it is provided in addition or as an alternative thereto that the particle beam apparatus has at least one mirror corrector for correcting chromatic and/or spherical aberration.

In one embodiment of the particle beam apparatus according to the system described herein, it is additionally or alternatively provided that the particle beam apparatus is designed as an electron beam apparatus and/or as an ion beam apparatus.

In a further configuration of the particle beam apparatus according to the system described herein, it is additionally or alternatively provided that the beam generator for generating a particle beam comprising charged primary particles is designed as a first beam generator for generating a first particle beam comprising first charged primary particles and the objective lens is designed as a first objective lens for focusing the first particle beam onto the object. Furthermore, the particle beam apparatus furthermore has at least one second beam generator for generating a second particle beam comprising second charged primary particles, and at least one second objective lens for focusing the second particle beam onto the object. The second charged primary particles are electrons or ions, for example.

BRIEF DESCRIPTION OF DRAWINGS

The system described herein is described in greater detail below on the basis of exemplary embodiments by means of drawings, in which.

DETAILED DESCRIPTION OF VARIOUS EMBODIMENTS

The system described herein is now explained in more detail by means of particle beam apparatuses in the form of an SEM and in the form of a combination apparatus, which has an electron beam column and an ion beam column. Reference is explicitly made to the fact that the system described herein can be used in any particle beam apparatus, in particular in each electron beam apparatus and/or in each ion beam apparatus.

Figure 1:
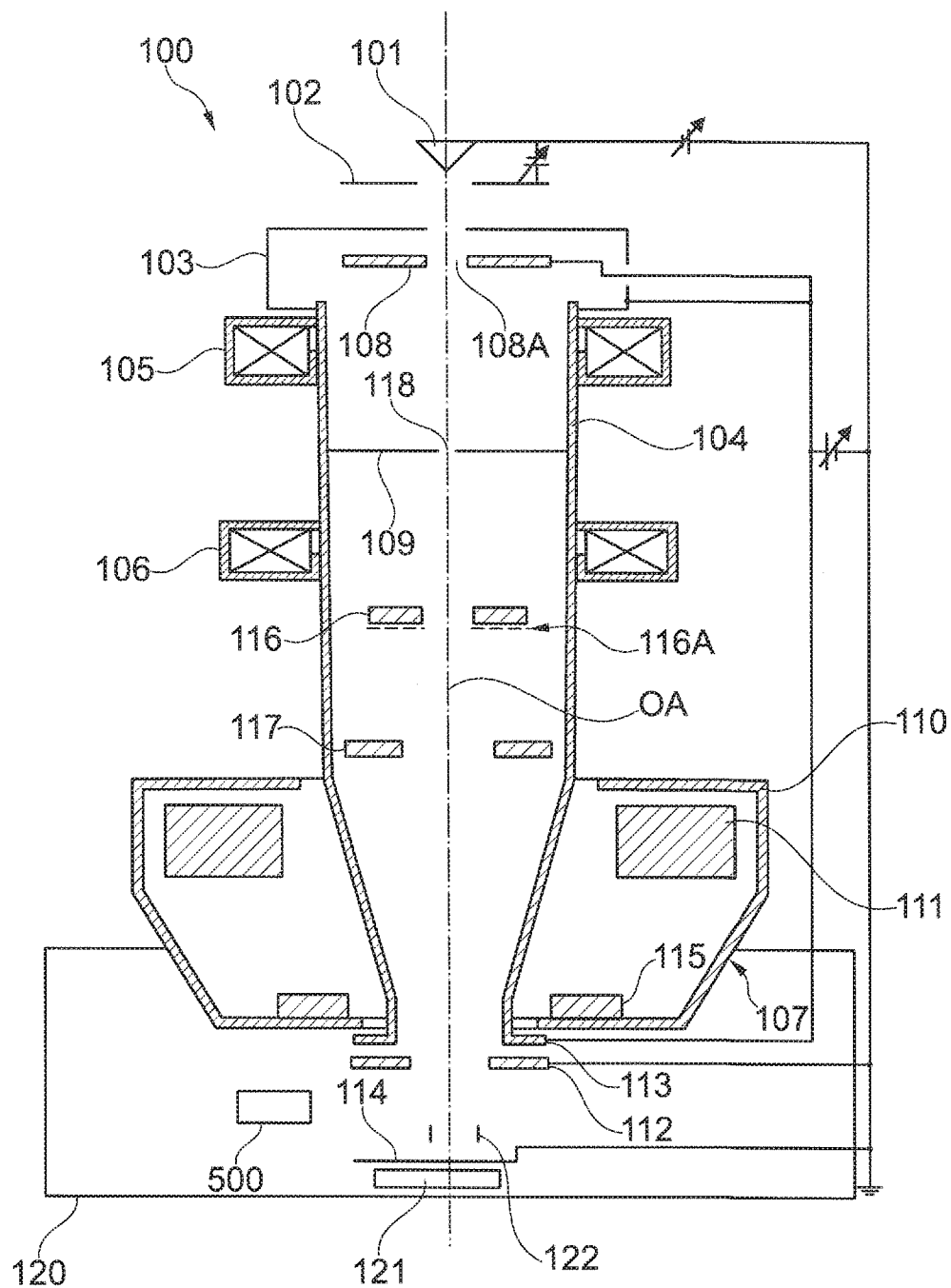
FIG. 1 shows a first embodiment of a particle beam apparatus according to the system described herein.

FIG. 1 shows a schematic illustration of an SEM 100. The SEM 100 has a first beam generator in the form of an electron source 101, which is embodied as a cathode. Furthermore, the SEM 100 is provided with an extraction electrode 102 and with an anode 103, which is placed onto one end of a beam guiding tube 104 of the SEM 100. By way of example, the electron source 101 is embodied as thermal field emitter. However, the invention is not restricted to such an electron source 101. Rather, any electron source is utilizable.

Electrons emerging from the electron source 101 form a primary electron beam. The electrons are accelerated to the anode potential due to a potential difference between the electron source 101 and the anode 103. In the exemplary embodiment depicted here, the anode potential is 1 kV to 20 kV, e.g. 5 kV to 15 kV, in particular 8 kV, in relation to a ground potential of a housing of a sample chamber 120. However, alternatively it could be at ground potential.

Two condenser lenses, namely a first condenser lens 105 and a second condenser lens 106, are arranged at the beam guiding tube 104. Here, proceeding from the electron source 101 as viewed in the direction of a first objective lens 107, the first condenser lens 105 is arranged first, followed by the second condenser lens 106. Reference is explicitly made to the fact that further embodiments of the SEM 100 may have only a single condenser lens. A first aperture unit 108 is arranged between the anode 103 and the first condenser lens 105. Together with the anode 103 and the beam guiding tube 104, the first aperture unit 108 is at a high voltage potential, namely the potential of the anode 103, or it is connected to ground. The first aperture unit 108 has numerous first apertures 108A, of which one is depicted in FIG. 1. Two first apertures 108A are present, for example. Each one of the numerous first apertures 108A has a different aperture diameter. By means of an adjustment mechanism (not depicted here), it is possible to set a desired first aperture 108A onto an optical axis OA of the SEM 100. Reference is explicitly made to the fact that, in further embodiments, the first aperture unit 108 can be provided with only a single aperture 108A. In this embodiment, the adjustment mechanism may be absent. The first aperture unit 108 is then designed in a stationary fashion. A stationary second aperture unit 109 is arranged between the first condenser lens 105 and the second condenser lens 106. The second aperture unit 109 may be designed in a movable fashion as an alternative thereto.

The first objective lens 107 has pole pieces 110, in which a bore is formed. The beam guiding tube 104 is guided through this bore. Furthermore, coils 111 are arranged in the pole pieces 110.

An electrostatic retardation device is arranged in a lower region of the beam guiding tube 104. It has a single electrode 112 and a tube electrode 113. The tube electrode 113 is arranged at one end of the beam guiding tube 104, which faces an object 114. Together with the beam guiding tube 104, the tube electrode 113 is at the potential of the anode 103, while the single electrode 112 and the object 114 are at a lower potential in relation to the potential of the anode 103. In the present case, this is the ground potential of the housing of the sample chamber 120. In this manner, the electrons of the primary electron beam can be decelerated to a desired energy which is required for examining the object 114.

The SEM 100 furthermore has a scanning device 115, by means of which the primary electron beam can be deflected and scanned over the object 114. Here, the electrons of the primary electron beam interact with the object 114. As a result of the interaction, interaction particles are produced, which are detected. In particular, electrons are emitted from the surface of the object 114—the so-called secondary electrons—or electrons of the primary electron beam are scattered back—the so-called backscattered electrons—as interaction particles.

The object 114 and the single electrode 112 may also be at different potentials and potentials different than ground. It is thereby possible to set the location of the retardation of the primary electron beam in relation to the object 114. By way of example, if the retardation is carried out very near to the object 114, imaging aberrations become smaller.

A detector arrangement comprising a first detector 116 and a second detector 117 is arranged in the beam guiding tube 104 for detecting the secondary electrons and/or the backscattered electrons. Here, the first detector 116 is arranged on the source-side along the optical axis OA, while the second detector 117 is arranged on the object-side along the optical axis OA in the beam guiding tube 104. The first detector 116 and the second detector 117 are arranged offset from one another in the direction of the optical axis OA of the SEM 100. Both the first detector 116 and the second detector 117 each have a passage opening, through which the primary electron beam can pass. The first detector 116 and the second detector 117 are approximately at the potential of the anode 103 and of the beam guiding tube 104. The optical axis OA of the SEM 100 extends through the respective passage openings.

The second detector 117 serves principally for detecting secondary electrons. Upon emerging from the object 114, the secondary electrons initially have a low kinetic energy and arbitrary directions of motion. By means of the strong extraction field emanating from the tube electrode 113, the secondary electrons are accelerated in the direction of the first objective lens 107. The secondary electrons enter the first objective lens 107 approximately parallel. The beam diameter of the beam of secondary electrons remains small in the first objective lens 107 as well. The objective lens 107 then has a strong effect on the secondary electrons and generates a comparatively short focus of the secondary electrons with sufficiently steep angles with respect to the optical axis OA, such that the secondary electrons diverge far apart from one another downstream of the focus and impinge on the second detector 117 on the active area thereof. By contrast, only a small proportion of electrons that are backscattered at the object 114—that is to say backscattered electrons—which have a relatively high kinetic energy in comparison with the secondary electrons upon emerging from the object 114, are detected by the second detector 117. The high kinetic energy and the angles of the backscattered electrons with respect to the optical axis OA upon emerging from the object 114 have the effect that a beam waist, that is to say a beam region having a minimum diameter, of the backscattered electrons lies in the vicinity of the second detector 117. A large portion of the backscattered electrons passes through the passage opening of the second detector 117. Therefore, the first detector 116 substantially serves to detect the backscattered electrons.

In a further embodiment of the SEM 100, the first detector 116 can additionally be embodied, with an opposing field grid 116A. The opposing field grid 116A is arranged at the side of the first detector 116 directed toward the object 114. With respect to the potential of the beam guiding tube 104, the opposing field grid 116A has such a negative potential that only backscattered electrons with a high energy pass through the opposing field grid 116A to the first detector 116. Additionally or alternatively, the second detector 117 has a further opposing field grid, which has an analogous embodiment to the aforementioned opposing field grid 116A of the first detector 116 and which has an analogous function.

The detection signals generated by the first detector 116 and the second detector 117 are used to generate an image or images of the surface of the object 114. Reference is explicitly made to the fact that the apertures of the first aperture unit 108 and of the second aperture unit 109, as well as the passage openings of the first detector 116 and of the second detector 117 are depicted in exaggerated fashion. The passage opening of the first detector 116 and of the second detector 117 have an extent perpendicular to the optical axis OA in the range of 0.5 mm to 5 mm. By way of example, they are of circular design and have a diameter in the range of 1 mm to 3 mm perpendicular to the optical axis OA.

The second aperture unit 109 is configured as a pinhole aperture in the exemplary embodiment depicted here and it is provided with a second aperture 118 for the passage of the primary electron beam, which has an extent in the range from 5 μm to 500 μm, e.g. 35 μm. In a further embodiment it is provided as an alternative thereto that the second aperture unit 109 is provided with a plurality of apertures, which can be displaced mechanically with respect to the primary electron beam or which can be reached by the primary electron beam by the use of electrical and/or magnetic deflection elements. The second aperture unit 109 is embodied as a pressure stage aperture. It separates a first region, in which the electron source 101 is arranged and in which an ultra-high vacuum ($10^{-6}$ Pa to $10^{-10}$ Pa) prevails, from a second region, which has a high vacuum ($10^{-1}$ Pa to $10^{-6}$ Pa). The second region is the intermediate pressure region of the beam guiding tube 104, which leads to the sample chamber 120.

In addition to image generation, the energy of the interaction particles is analyzed in the SEM 100 illustrated here. For this purpose, an analysis device 500 is arranged in the region of the sample chamber 120 for example between the beam guiding tube 104 and the object 114 laterally with respect to the object 114. In order to direct the interaction particles onto the analysis device 500, the object 114 may be tilted and the potential of the individual electrode 112 may be chosen in such a way that the interaction particles reach the analysis device 500. In addition or as an alternative thereto, provision is made for directing the interaction particles in the direction of the analysis device 500 by means of a beam deflector 122, which is illustrated schematically.

The SEM 100 furthermore has a fourth detector 121, which is arranged in the sample chamber 120. More precisely, the fourth detector 121 is arranged behind the object 114, as seen from the electron source 101 along the optical axis OA. The primary electron beam passes through the object 114 to be examined. When the primary electron beam passes through the object 114 to be examined, the electrons of the primary electron beam interact with the material of the object 114 to be examined. The electrons passing through the object 114 to be examined are detected by the fourth detector 121.

Figure 2:
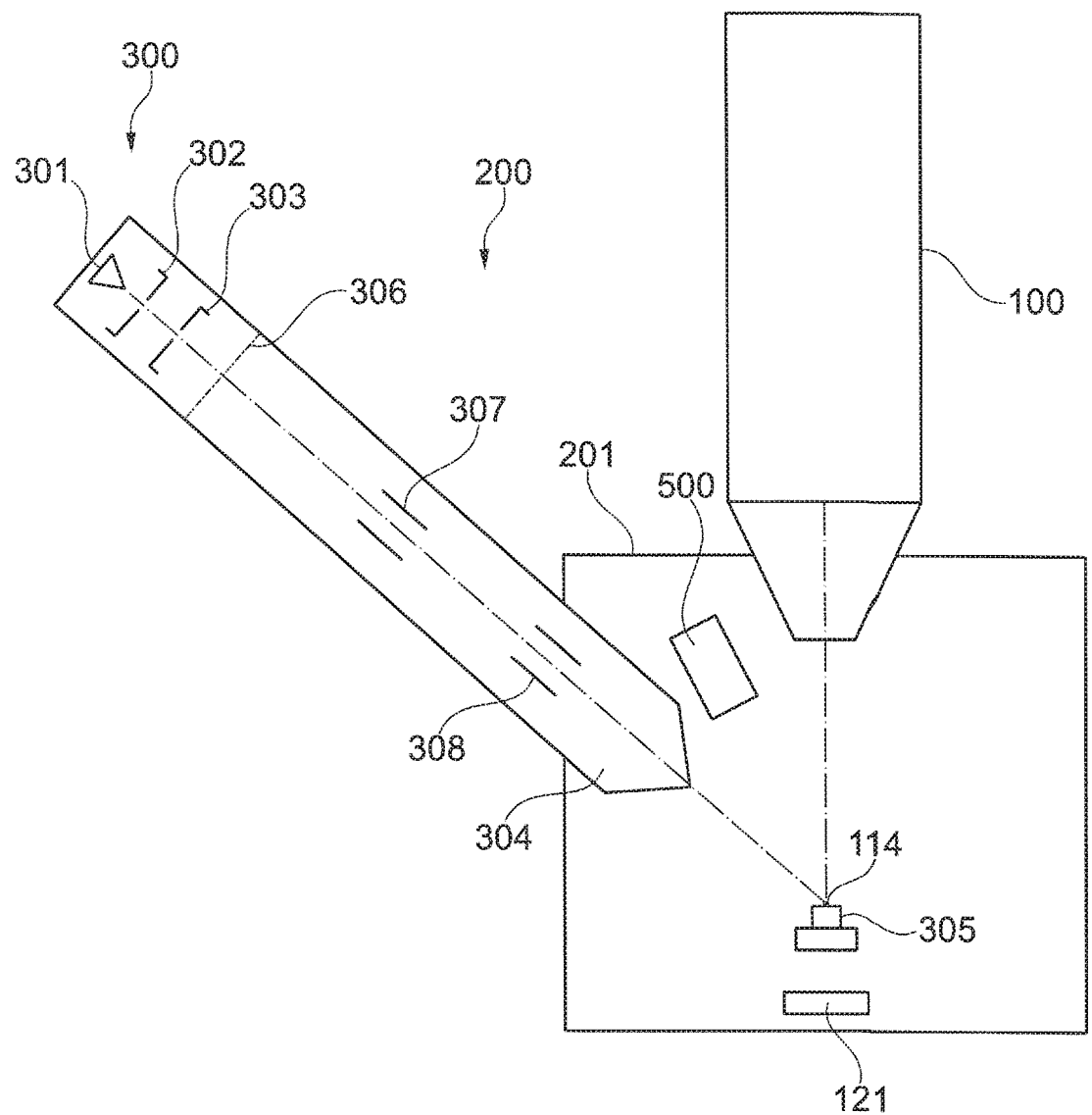
FIG. 2 shows a second embodiment of a particle beam apparatus according to the system described herein.

FIG. 2 shows a particle beam apparatus in the form of a combination apparatus 200. The combination apparatus 200 has two particle beam columns. Firstly, the combination apparatus 200 is provided with the SEM 100, as already depicted in FIG. 1, but without the sample chamber 120. Rather, the SEM 100 is arranged at a sample chamber 201. The SEM 100 serves to generate a first particle beam, namely the primary electron beam already described further above. Secondly, the combination apparatus 200 is provided with an ion beam apparatus 300, which is likewise arranged at the sample chamber 201.

The SEM 100 is arranged vertically in relation to the sample chamber 201. By contrast, the ion beam apparatus 300 is arranged inclined by an angle of approximately 50° in relation to the SEM 100. It has a second beam generator in the form of an ion beam generator 301. Ions, which form a second particle beam in the form of an ion beam, are generated by the ion beam generator 301. The ions are accelerated by means of an extraction electrode 302, which is at a predeterminable potential. The second particle beam then reaches through ion optics of the ion beam apparatus 300, wherein the ion optics comprise a condenser lens 303 and a second objective lens 304. The second objective lens 304 ultimately generates an ion probe, which is focused on the object 114 arranged on a sample holder 305.

An adjustable aperture 306, a first electrode arrangement 307 and a second electrode arrangement 308 are arranged above the objective lens 304 (i.e. in the direction of the ion beam generator 301), wherein the first electrode arrangement 307 and the second electrode arrangement 308 are embodied as scanning electrodes. The second particle beam is scanned over the surface of the object 114 by means of the first electrode arrangement 307 and the second electrode arrangement 308, wherein the first electrode arrangement 307 acts in a first direction and the second electrode arrangement 308 acts in a second direction, which is counter to the first direction. Using this, there is effected the scanning in e.g. an x-direction. The scanning in a y-direction perpendicular thereto is brought about by further electrodes (not depicted here), which are rotated by 90°, at the first electrode arrangement 307 and at the second electrode arrangement 308.

The distances depicted in FIG. 2 between the individual units of the combination apparatus 200 are depicted in exaggerated fashion in order to better depict the individual units of the combination apparatus 200.

An analysis device 500 is arranged in the sample chamber 201 and analyzes interaction particles which arise on account of an interaction of the primary electron beam with the object 114 or on account of an interaction of the ion beam with the object 114. By way of example, the interaction particles are secondary electrons, backscattered electrons and/or secondary ions.

Figure 3:
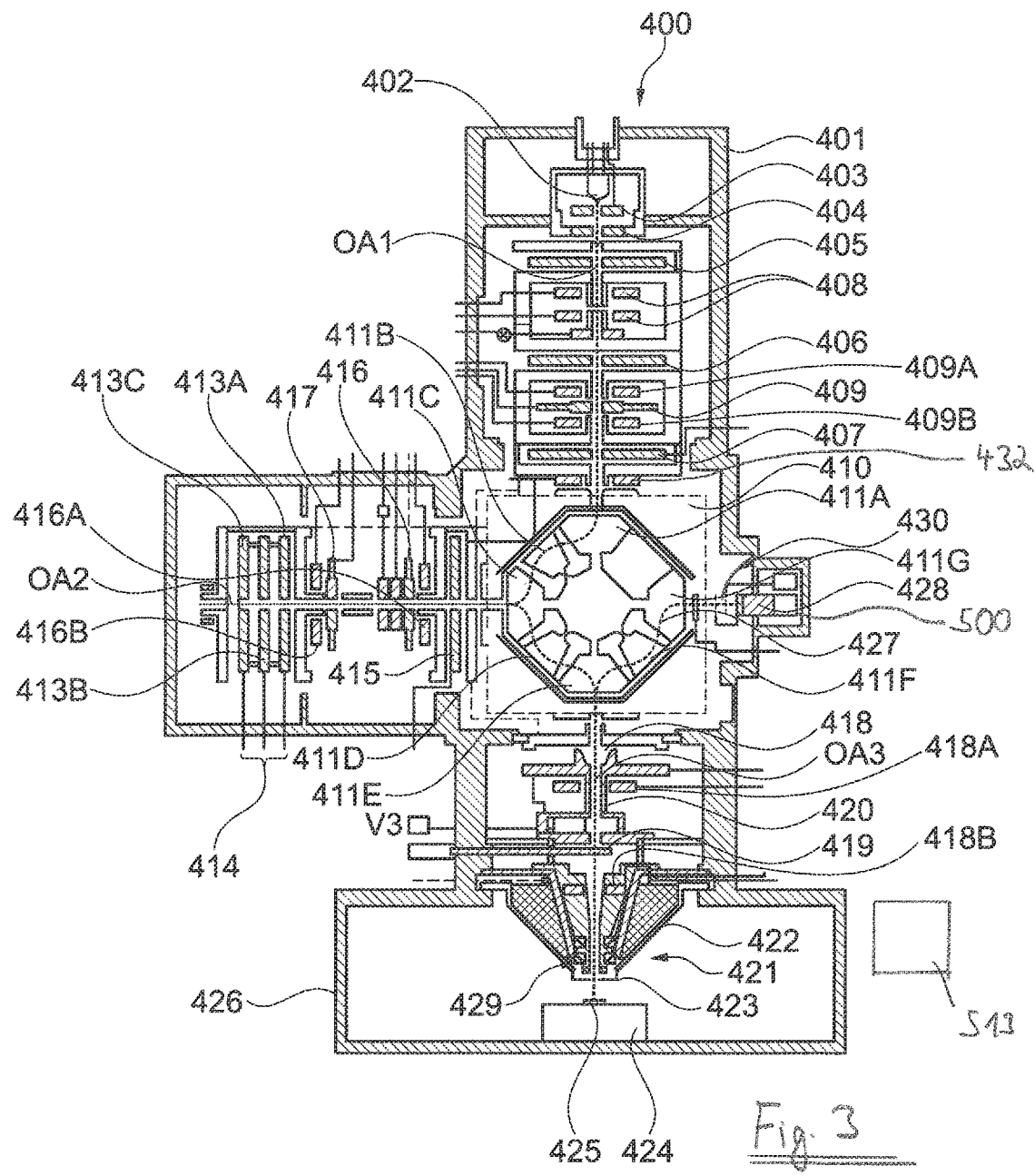
FIG. 3 shows a third embodiment of a particle beam apparatus according to the system described herein.

FIG. 3 is a schematic illustration of a further exemplary embodiment of a particle beam apparatus according to the system described herein. This exemplary embodiment of the particle beam apparatus is provided with the reference sign 400 and comprises a mirror corrector for correcting e.g. chromatic and spherical aberrations. The particle beam apparatus 400 comprises a particle beam column 401, which is embodied as an electron beam column and substantially corresponds to an electron beam column of a corrected SEM. However, the particle beam apparatus 400 is not restricted to an SEM with a mirror corrector. Rather, the particle beam apparatus can comprise any type of correction units.

The particle beam column 401 comprises a particle beam generator in the form of an electron source 402 (cathode), an extraction electrode 403, and an anode 404. By way of example, the electron source 402 is embodied as a thermal field emitter. Electrons emerging from the electron source 402 are accelerated to the anode 404 due to a potential difference between the electron source 402 and the anode 404. Accordingly, a particle beam in the form of an electron beam is formed along a first optical axis OA1.

The particle beam is guided along a beam path, which corresponds to the first optical axis OA1, after the particle beam has emerged from the electron source 402. A first electrostatic lens 405, a second electrostatic lens 406, and a third electrostatic lens 407 are used to guide the particle beam.

Furthermore, the particle beam is adjusted along the beam path using a beam guiding device. The beam guiding device of this exemplary embodiment comprises a source adjustment unit with two magnetic deflection units 408 arranged along the first optical axis OA1. Moreover, the particle beam apparatus 400 comprises electrostatic beam deflection units. A first electrostatic beam deflection unit 409, which is also embodied as a quadrupole in one exemplary embodiment, is arranged between the second electrostatic lens 406 and the third electrostatic lens 407. The first electrostatic beam deflection unit 409 is likewise arranged downstream of the magnetic deflection units 408. A first multi-pole unit 409A in the form of a first magnetic deflection unit is arranged at one side of the first electrostatic beam deflection unit 409. Moreover, a second multi-pole unit 409B in the form of a second magnetic deflection unit is arranged at the other side of the first electrostatic beam deflection unit 409. The first electrostatic beam deflection unit 409, the first multi-pole unit 409A, and the second multi-pole unit 409B are adjusted for the purposes of adjusting the particle beam in respect of the axis of the third electrostatic lens 407 and the entrance window of a beam deflection device 410. The first electrostatic beam deflection unit 409, the first multi-pole unit 409A and the second multi-pole unit 409B can interact like a Wien filter. A further magnetic deflection element 432 is arranged at the entrance to the beam deflection device 410.

The beam deflection device 410 is used as a particle beam deflector, which deflects the particle beam in a specific manner. The beam deflection device 410 comprises a plurality of magnetic sectors, namely a first magnetic sector 411A, a second magnetic sector 411B, a third magnetic sector 411C, a fourth magnetic sector 411D, a fifth magnetic sector 411E, a sixth magnetic sector 411F, and a seventh magnetic sector 411G. The particle beam enters the beam deflection device 410 along the first optical axis OA1 and it is deflected by the beam deflection device 410 in the direction of a second optical axis OA2. The beam deflection is performed by means of the first magnetic sector 411A, by means of the second magnetic sector 411B and by means of the third magnetic sector 411C by an angle of 30° to 120°. The second optical axis OA2 is therefore oriented at the same angle with respect to the first optical axis OA1. The beam deflection device 410 also deflects the particle beam which is guided along the second optical axis OA2, to be precise in the direction of a third optical axis OA3. The beam deflection is provided by the third magnetic sector 411C, the fourth magnetic sector 411D, and the fifth magnetic sector 411E. In the exemplary embodiment in FIG. 3, the deflection with respect to the second optical axis OA2 and with respect to the third optical axis OA3 is provided by deflecting the particle beam at an angle of 90°. Hence, the third optical axis OA3 extends coaxially with respect to the first optical axis OA1. However, reference is made to the fact that the particle beam apparatus 400 according to the system described herein is not restricted to deflection angles of 90°. Rather, any suitable deflection angle can be selected by the beam deflection device 410, for example 70° or 110°, such that the first optical axis OA1 does not extend coaxially with respect to the third optical axis OA3. In respect of further details of the beam deflection device 410, reference is made to WO 2002/067286 A2. which is incorporated herein by reference.

After the particle beam is deflected by the first magnetic sector 411A, the second magnetic sector 411B, and the third magnetic sector 411C, the particle beam is guided along the second optical axis OA2. The particle beam is guided to an electrostatic mirror 414 and it extends on its path to the electrostatic mirror 414 along a fourth electrostatic lens 415, a third multi-pole unit 416A in the form of a magnetic deflection unit, a second electrostatic beam deflection unit 416, a third electrostatic beam deflection unit 417, and a fourth multi-pole unit 416B in the form of a magnetic deflection unit. The electrostatic mirror 414 comprises a first mirror electrode 413A, a second mirror electrode 413B, and a third mirror electrode 413C. Electrons of the particle beam which are reflected back at the electrostatic mirror 414 once again extend along the second optical axis OA2 and re-enter the beam deflection device 410. Then, they are deflected to the third optical axis OA3 by the third magnetic sector 411C, the fourth magnetic sector 411D, and the fifth magnetic sector 411E. The electrons of the particle beam emerge from the beam deflection device 410 and are guided along the third optical axis OA3 to the object 425 which is intended to be examined. On the path to the object 425, the particle beam is guided to a fifth electrostatic lens 418, a beam guiding tube 420, a fifth multi-pole unit 418A, a sixth multi-pole unit 418B, and an objective lens 421. The fifth electrostatic lens 418 is an electrostatic immersion lens. By way of the fifth electrostatic lens 418, the particle beam is decelerated or accelerated to an electric potential of the beam guiding tube 420.

By means of the objective lens 421, the particle beam is focused in a focal plane in which the object 425 is arranged. The object 425 is arranged on a movable sample stage 424. The movable sample stage 424 is arranged in a sample chamber 426 of the particle beam apparatus 400.

The objective lens 421 can be embodied as a combination of a magnetic lens 422 and a sixth electrostatic lens 423. The end of the beam guiding tube 420 furthermore can be an electrode of an electrostatic lens. After emerging from the beam guiding tube 420, particles of the particle beam apparatus are decelerated to a potential of the object 425 arranged on the sample stage 424. The objective lens 421 is not restricted to a combination of the magnetic lens 422 and the sixth electrostatic lens 423. Rather, the objective lens 421 can assume any suitable form. By way of example, the objective lens also can be embodied as a purely magnetic lens or as a purely electrostatic lens.

The particle beam which is focused onto the object 425 interacts with the object 425. Interaction particles are generated. In particular, secondary electrons are emitted from the object 425 or backscattered electrons are scattered back at the object 425. The secondary electrons or the backscattered electrons are accelerated again and guided into the beam guiding tube 420 along the third optical axis OA3. In particular, the trajectories of the secondary electrons and the backscattered electrons extend on the route of the beam path of the particle beam in the opposite direction to the particle beam.

The particle beam apparatus 400 comprises a first detector 419 which is arranged between the beam deflection device 410 and the objective lens 421 along the beam path. Secondary electrons traveling in directions aligned at a large angle with respect to the third optical axis OA3 are detected by the first detector 419. Backscattered electrons and secondary electrons which have a small axial distance with respect to the third optical axis OA3 at the location of the first detector 419—i.e. backscattered electrons and secondary electrons which have a small distance from the third optical axis OA3 at the location of the first detector 419—enter the beam deflection device 410 and are deflected to an analysis detector 428 of an analysis device 500 by the fifth magnetic sector 411E, the sixth magnetic sector 411F and the seventh magnetic sector 411G along a detection beam path 427. This is discussed in more detail further below. By way of example, the deflection angle is 90° or 110°.

The first detector 419 generates detection signals which are largely generated by emitted secondary electrons. The detection signals which are generated by the first detector 419 are guided to an electronics unit (not depicted here) and used to obtain information about the properties of the interaction region of the focused particle beam with the object 425. In particular, the focused particle beam is scanned over the object 425 using a scanning device 429. Then, an image of the scanned region of the object 425 can be generated by the detection signals, which are generated by the first detector 419, and it can be displayed on a display unit, for example a monitor.

The analysis device 500 has an opposing field grid device 430 arranged upstream of the analysis detector 428. Various embodiments of the analysis device 500 which may be or are arranged in one of the abovementioned particle beam apparatuses 100, 200 and 400 are explained in greater detail below.

Figure 4:
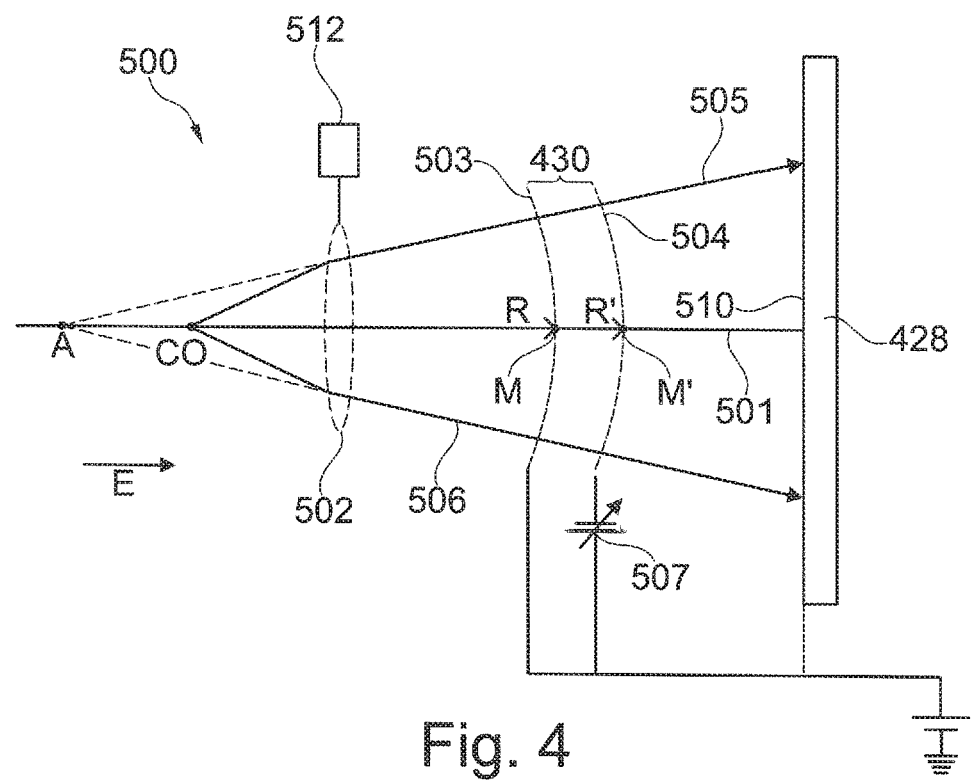
FIG. 4 shows a schematic illustration of a first embodiment of an analysis device for a particle beam apparatus according to the system described herein.

A first exemplary embodiment of the analysis device 500 will now be explained in greater detail with reference to FIG. 4. The analysis detector 428 is provided with a detection area 510 on which impinge the interaction particles for example in the form of the secondary electrons and backscattered electrons. The secondary electrons and backscattered electrons move along an optical axis 501 of the analysis device 500 in the direction of the analysis detector 428.

The opposing field grid device 430 has a first grid 503 and a second grid 504. The first grid 503 and the second grid 504 are arranged at a constant distance with respect to one another. To put it more precisely, the first grid 503 and the second grid 504 are arranged concentrically with respect to one another. The first grid 503 has a first curvature and the second grid 504 has a second curvature. The first curvature and the second curvature are curved opposite to the direction of the direction E of incidence—a direction of movement of the interaction particles. It is provided, in particular, that the first grid 503 and the second grid 504 are designed in a spherical fashion. Furthermore, the first grid 503 and the second grid 504 may also be designed in each case as a sphere segment.

The curvature of the first grid 503 is discussed below. The optical axis 501 extends through the first grid 503. The first grid 503 has a center M of curvature which is an intersection point of the optical axis 501 with the first grid 503. The curvature has a radius R of curvature which is given by the section between the center M of curvature and a starting point A on the optical axis 501. The same holds true analogously with regard to the curvature of the second grid 504, wherein the second grid 504 has an intersection point with the optical axis 501 that corresponds to the center M' of curvature of the curvature of the second grid 504. The corresponding starting point for the radius R' of curvature of the curvature of the second grid 504 is once again the starting point A. Both the first grid 503 and the second grid 504 are curved in the direction of the starting point A as viewed from the center M, M' of curvature.

Furthermore, the analysis device 500 has an electrostatic and/or magnetic lens 502, wherein proceeding from the analysis detector 428, as viewed in a direction opposite to the direction E of incidence of the interaction particles, firstly the analysis detector 428, then the opposing field grid device 430 and then the electrostatic and/or magnetic lens 502 are arranged. To put it another way, the abovementioned units proceeding from the analysis detector 428, as viewed in the direction opposite to the direction E of incidence of the interaction particles, are arranged in the following order: the analysis detector 428—the opposing field grid device 430—the electrostatic and/or magnetic lens 502. The electrostatic and/or magnetic lens 502 is arranged along the optical axis 501 between the starting point A and the center M of curvature of the first grid 503. Furthermore, a crossover CO of the interaction particles is arranged on the optical axis 501 between the electrostatic and/or magnetic lens 502 and the starting point A. With regard to the definition of the crossover, reference is made to the text further above. The electrostatic and/or magnetic lens 502 is excited in such a way that, on the one hand, the interaction particles which move near the optical axis 501 are further guided near to the optical axis 501 and along the optical axis 501. Interaction particles which pass far from the optical axis 501 are guided in a direction toward the optical axis 501. The last-mentioned interaction particles are provided with the reference signs 505 and 506.

By means of a voltage setting unit 507 it is possible to apply a voltage to the opposing field grid device 430 in such a way that the secondary electrons are reflected by the opposing field grid device 430 and not detected by the analysis detector 428. The backscattered electrons having an energy above or equal to a threshold energy predefined by the voltage are not reflected by the opposing field grid device 430. They pass through the opposing field grid device 430 and impinge on the detection area 510 of the analysis detector 428. They are accordingly detected. Accordingly, only interaction particles having an energy equal to or higher than the threshold energy are detected.

The first grid 503 and the reference point of the voltage setting unit 507 may in each case be at ground or at anode potential. Furthermore, the detection area 510 has an electrical potential relative to the second grid 504 in such a way that it is also possible to detect the backscattered electrons. By way of example, the detection area 510 is at anode potential or at ground potential.

It may happen that the position of the crossover CO on the optical axis 501 changes. By way of example, this occurs in the case of a change in imaging properties of the particle beam apparatus 100, 200 or 400 in which the analysis device 500 is arranged. An excitation of the electrostatic and/or magnetic lens 502 that is adapted to the displacement of the crossover CO makes it possible to compensate for said displacement. The electrostatic and/or magnetic lens 502 is always excited in such a way that, on the one hand, the interaction particles which move near the optical axis 501 are further guided near to the optical axis 501 and along the optical axis 501. On the other hand, interaction particles that pass far from the optical axis 501 are guided in a direction toward the optical axis 501. Upon passing through the opposing field grid device 430, both backscattered electrons having an energy higher than the threshold energy which pass near the optical axis 501 and backscattered electrons having an energy higher than the threshold energy which pass far from the optical axis 501 then pass through the opposing field generated in the opposing field grid device 430 parallel or substantially parallel to the opposing field and impinge on the detection area 510 of the analysis detector 428.

The excitation of the electrostatic and/or magnetic lens 502 is so low that an aperture aberration of the electrostatic and/or magnetic lens 502 has hardly any influence on the interaction particles passing through the electrostatic and/or magnetic lens 502. Furthermore, the system described herein affords the possibility of defining the length of the section between the starting point A and the electrostatic and/or magnetic lens 502 by means of an initial choice of the curvature of the opposing field grid device 430. Accordingly, the curvature may initially be chosen in such a way that the various possible positions of the crossover CO may be taken into account which may arise for example for different imaging properties of the particle beam apparatus 100, 200 or 400 in which the analysis device 500 is arranged.

The analysis device 500 has a control device 512 for controlling the excitation of the electrostatic and/or magnetic lens 502, wherein the control device 512 is configured in such a way that the excitation of the electrostatic and/or magnetic lens 502 is controlled depending on the voltage applied to the opposing field grid device 430 (that is to say the potential of the second grid 504). To put it another way, the excitation of the electrostatic and/or magnetic lens 502 is controlled depending on the threshold energy. As already explained above, for example, the crossover CO of the charged particles of the secondary beam may be placed at the starting point A. In addition or as an alternative thereto, provision is made for driving, by means of a control unit 513 (cf. FIG. 3), the excitation of the sixth magnetic sector 411F and/or of the seventh magnetic sector 411G depending on the voltage applied to the opposing field grid device 430. However, the invention is not restricted thereto. Rather, any suitable beam deflection unit and/or beam shaping unit may be used for this purpose.

Figure 5:
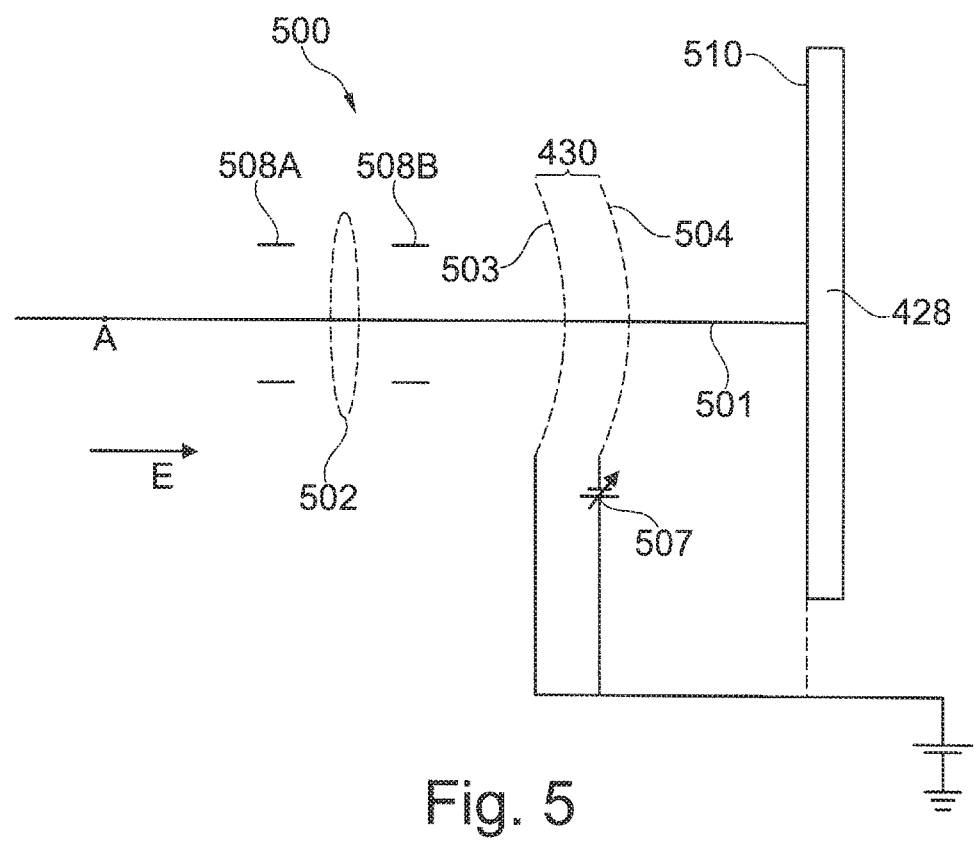
FIG. 5 shows a schematic illustration of a second embodiment of an analysis device for a particle beam apparatus according to the system described herein.

FIG. 5 shows a further embodiment of the analysis device 500. FIG. 5 is based on FIG. 4. Identical component parts are provided with the same reference signs. Therefore, reference is firstly made to the explanations given further above, which also apply to the embodiment in FIG. 5. In contrast to the embodiment in FIG. 4, the embodiment in FIG. 5 has an electrostatic or magnetic stigmator 508A or an electrostatic or magnetic stigmator 508B. It has been found that the crossover CO of the interaction particles may be situated at different positions of the optical axis 501 in an x-section along an x-axis and a y-section along a y-axis, wherein the optical axis 501 is a z-axis and wherein the x-axis, the y-axis and the z-axis are aligned perpendicular to one another. In order to compensate for this, the embodiment of the analysis device 500 in FIG. 5 provides for using the stigmator 508A or 508B. In this regard, for example, proceeding from the analysis detector 428, as viewed in the direction opposite to the direction E of incidence of the interaction particles, firstly the electrostatic and/or magnetic lens 502 and then the stigmator 508A are arranged. Furthermore, the electrostatic and/or magnetic lens 502 has minimum focal length. The distance between the stigmator 508A and the electrostatic and/or magnetic lens 502 corresponds for example maximally to said minimum focal length. However, the position of the stigmator in the analysis device 500 is not restricted to the abovementioned arrangement. Rather, alternatively provision is made, proceeding from the analysis detector 428, as viewed in the direction opposite to the direction E of incidence of the interaction particles, for arranging firstly the stigmator 508B and then the electrostatic and/or magnetic lens 502. Here, too, it is provided that the distance between the stigmator 508B and the electrostatic and/or magnetic lens 502 maximally corresponds to the minimum focal length of the electrostatic and/or magnetic lens 502.

Figure 6:
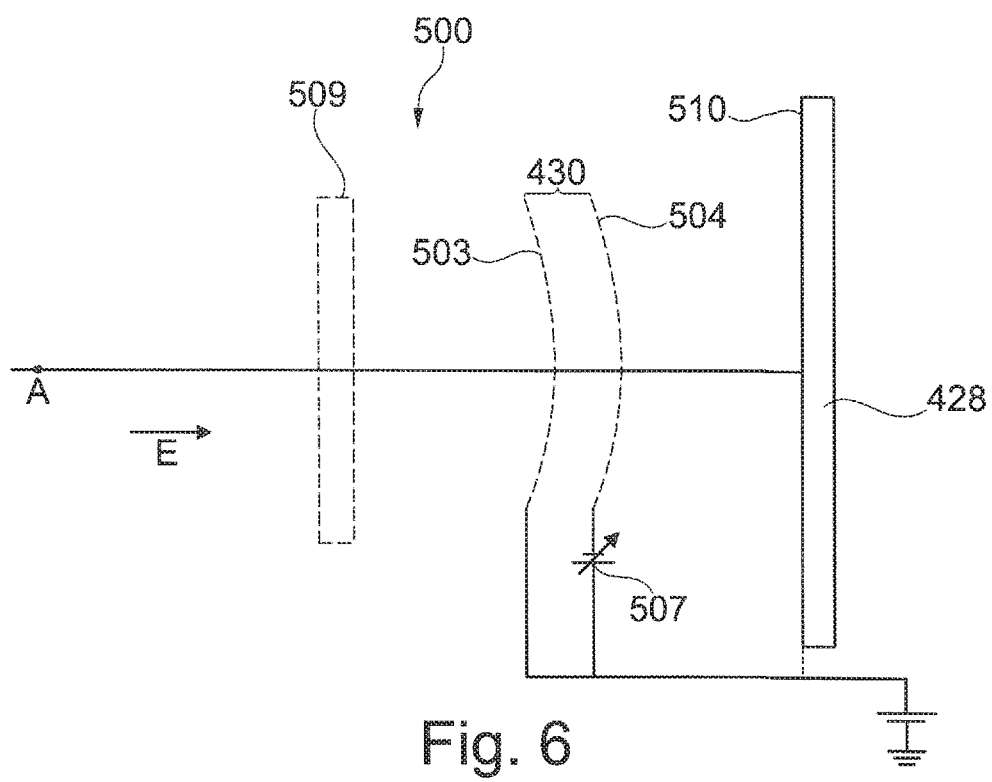
FIG. 6 shows a schematic illustration of a third embodiment of an analysis device for a particle beam apparatus according to the system described herein.

FIG. 6 shows a further embodiment of the analysis device 500. FIG. 6 is likewise based on FIG. 4. Identical component parts are provided with the same reference signs. Therefore, reference is firstly made to the explanations given further above, which also apply to the embodiment in FIG. 6. In contrast to the embodiment in FIG. 4, the embodiment in FIG. 6 has a particle-optical unit 509 which forms the electrostatic and/or magnetic lens and the stigmator. By way of example, the particle-optical unit 509 is designed as an electrostatic lens having one electrode or a plurality of electrodes, which may be designed to be magnetic or non-magnetic. The electrode or the plurality of electrodes are segmented and have a plurality of segments. The individual segments are provided with additional windings or different voltages may be applied to said individual segments in such a way that the latter may have the function of the electrostatic lens, on the one hand, and the function of the stigmator, on the other hand. In the case of a magnetic lens, it is provided, for example, that pole pieces of the magnetic lens are segmented and are provided with additional windings or different voltages may be applied to said pole pieces in order to realize the two functions mentioned above. Alternatively, in the case of a magnetic lens, the stigmator may also be designed as separate coils, for example air-core coils or air-core windings, wherein the coils are arranged in the vicinity of a pole piece of the magnetic lens between the pole piece and the optical axis or in a pole piece gap between the two pole pieces of the magnetic lens.

Figure 7:
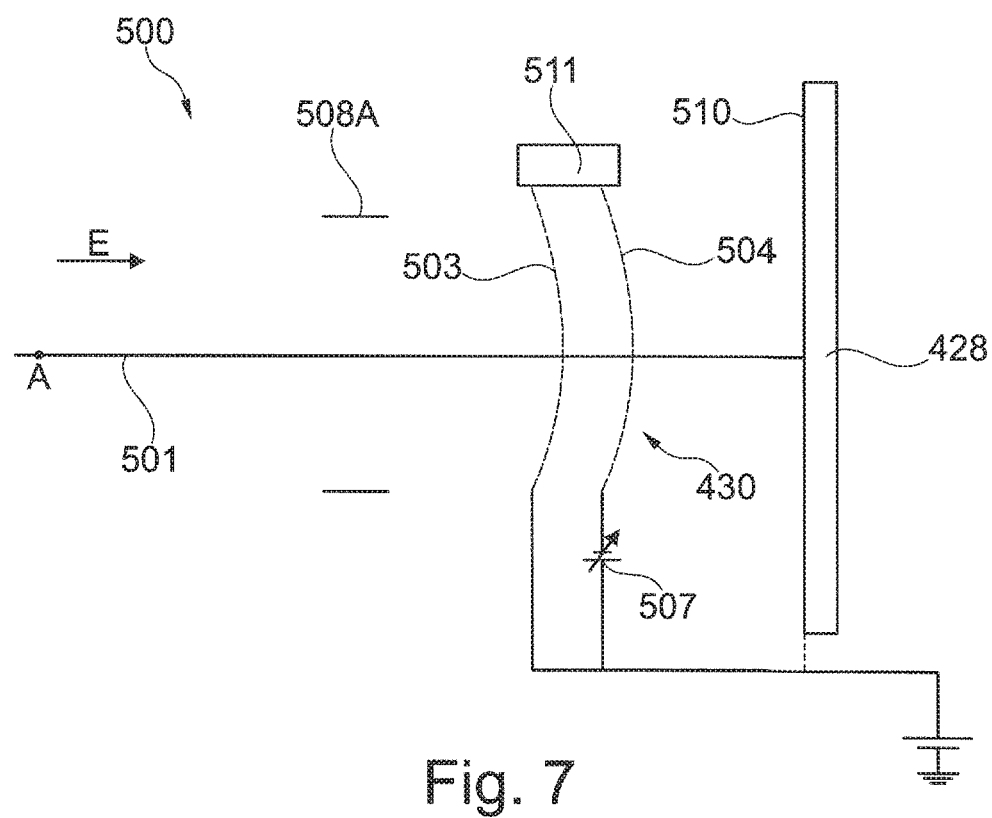
FIG. 7 shows a schematic illustration of a fourth embodiment of an analysis device for a particle beam apparatus according to the system described herein.

FIG. 7 shows a further embodiment of the analysis device 500. FIG. 7 is based on FIG. 4. Identical component parts are provided with the same reference signs. Therefore, reference is firstly made to the explanations given further above, which also apply to the embodiment in FIG. 7. In contrast to the embodiment in FIG. 4, the embodiment in FIG. 7 has no electrostatic and/or magnetic lens. Rather, the opposing field grid device 430 is arranged such that it is displaceable along the optical axis 501 by means of a drive unit 511. FIG. 7 shows the opposing field grid device 430 in a starting position that provides the radii R and R' of curvature. On account of the displaceable opposing field grid device 430, this embodiment of the analysis device 500 has effects that have already been explained further above.

The drive unit 511 is configured in such a way that the movement of the opposing field grid device 430 is controlled depending on the voltage applied to the opposing field grid device 430.

In addition, the embodiment in FIG. 7 may have a stigmator 508A. Proceeding from the analysis detector 428, as viewed in the direction opposite to the direction E of incidence of the interaction particles, firstly the analysis detector 428, then the opposing field grid device 430 and then the stigmator 508A are arranged. The stigmator 508A is of magnetic or electrostatic design.

Figure 8:
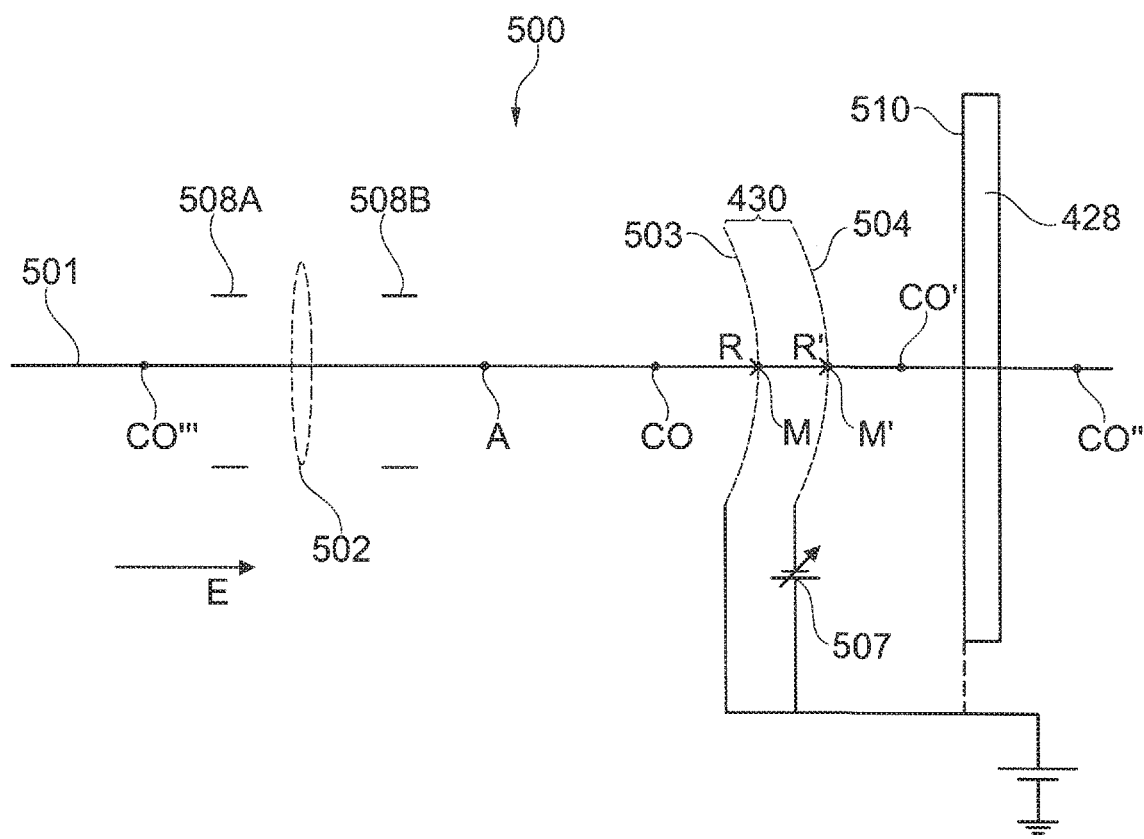
FIG. 8 shows a schematic illustration of a fifth embodiment of an analysis device for a particle beam apparatus according to the system described herein.

FIG. 8 shows a further embodiment of the analysis device 500. FIG. 8 is based on FIG. 4. Identical components parts are provided with the same reference signs. Therefore, reference is firstly made to the explanations given further above, which also apply to the embodiment in FIG. 8. In contrast to the embodiment in FIG. 4, in the embodiment in FIG. 8 the starting point A is arranged on the optical axis 501 between the electrostatic and/or magnetic lens 502 and the opposing field grid device 430. In this exemplary embodiment, the crossover CO of the interaction particles is arranged on the optical axis 501 proceeding from the starting point A as viewed in the direction E of incidence, for example between the starting point A and the opposing field grid device 430. The crossover CO of the interaction particles may also be arranged on the optical axis 501 downstream of the opposing field grid device 430 (designated as CO' in FIG. 8) and also additionally downstream of the analysis detector 428 (designated by CO" in FIG. 8) proceeding from the starting point A as viewed in the direction E of incidence. The crossover CO or CO' may then be a virtual crossover. The crossover CO" is always a virtual crossover since it lies downstream of the analysis detector 428 in the direction E of incidence of the charged particles. As an alternative thereto, another exemplary embodiment provides for arranging the crossover CO'" on the optical axis 501 proceeding from the electrostatic and/or magnetic lens 502 as viewed in a direction opposite to the direction E of incidence of the interaction particles. The crossover CO'" is then real. The exemplary embodiment in FIG. 8 furthermore also exhibits an electrostatic or magnetic stigmator 508A or an electrostatic or magnetic stigmator 508B. In this respect, reference is also made to the explanations further above.

Figure 9:
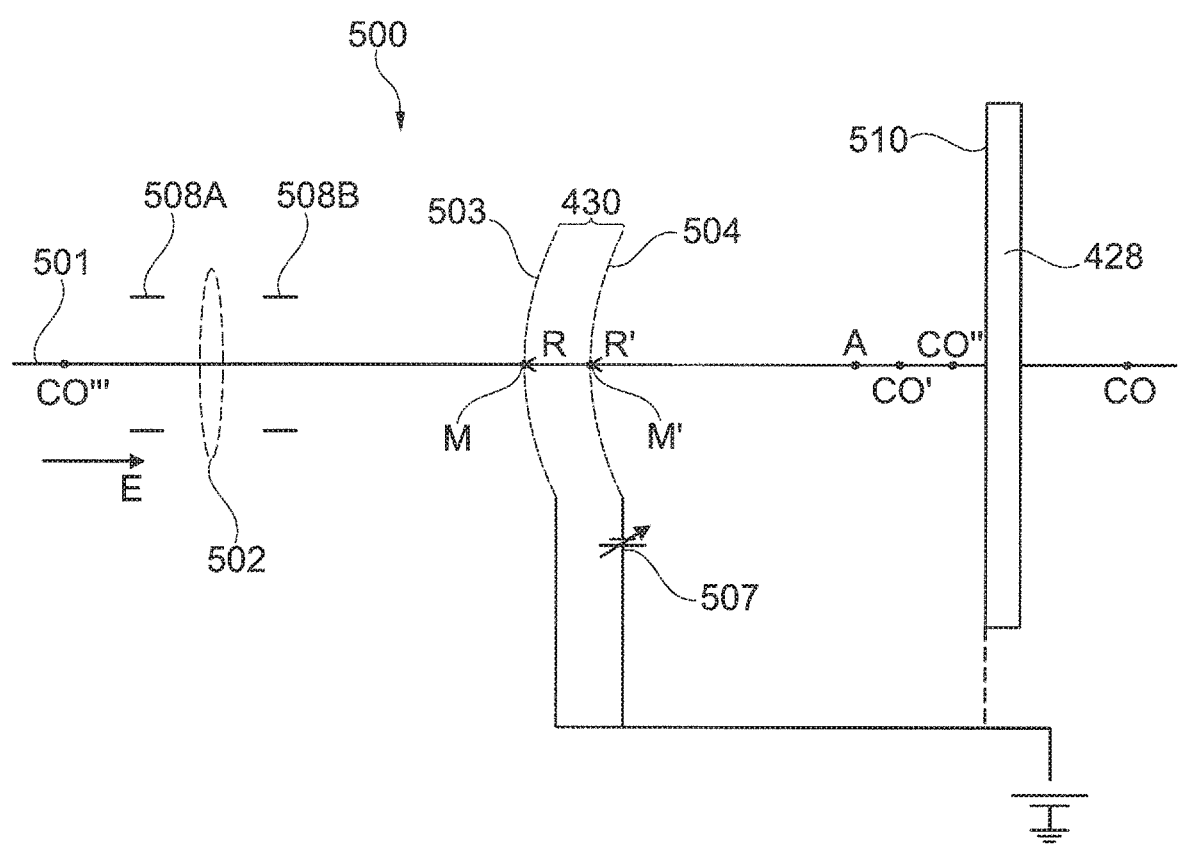
FIG. 9 shows a schematic illustration of a sixth embodiment of an analysis device for a particle beam apparatus according to the system described herein.

FIG. 9 shows a further embodiment of the analysis device 500. FIG. 9 is based on FIG. 4. Identical component parts are provided with the same reference signs. Therefore, reference is firstly made to the explanations given further above, which also apply to the embodiment in FIG. 9. In contrast to the embodiment in FIG. 4, in the embodiment in FIG. 9 the starting point A is arranged on the optical axis 501 between the opposing field grid device 430 and the analysis detector 428. Both the first grid 503 and the second grid 504 of the opposing field grid device 430 are curved in the direction of the starting point A. In the embodiment illustrated here, the first grid 503 and the second grid 504 are curved in a direction E of incidence of the interaction particles. In this exemplary embodiment, the crossover CO of the interaction particles is arranged on the optical axis 501 proceeding from the starting point A as viewed in the direction E of incidence, for example downstream of the analysis detector 428 as viewed in the direction E of incidence. Alternatively, however, it may also be arranged between the starting point A and the analysis detector 428, for example as CO' or as CO". The crossover CO or CO" may then be a virtual crossover. The crossover CO is always a virtual crossover since it lies downstream of the analysis detector 428 as viewed in the direction E of incidence of the charged particles. As an alternative thereto, another exemplary embodiment provides for arranging the crossover CO'" on the optical axis 501 proceeding from the electrostatic and/or magnetic lens 502 as viewed in a direction opposite to the direction E of incidence of the interaction particles. The crossover CO'" is then real. The exemplary embodiment in FIG. 9 furthermore also exhibits an electrostatic or magnetic stigmator 508A or an electrostatic or magnetic stigmator 508B. In this respect, reference is also made to the explanations further above. Furthermore, it is pointed out that the distance between the opposing field grid device 430 and the analysis detector 428 should be understood to be merely schematic. The distance may be chosen suitably.

Figure 10:
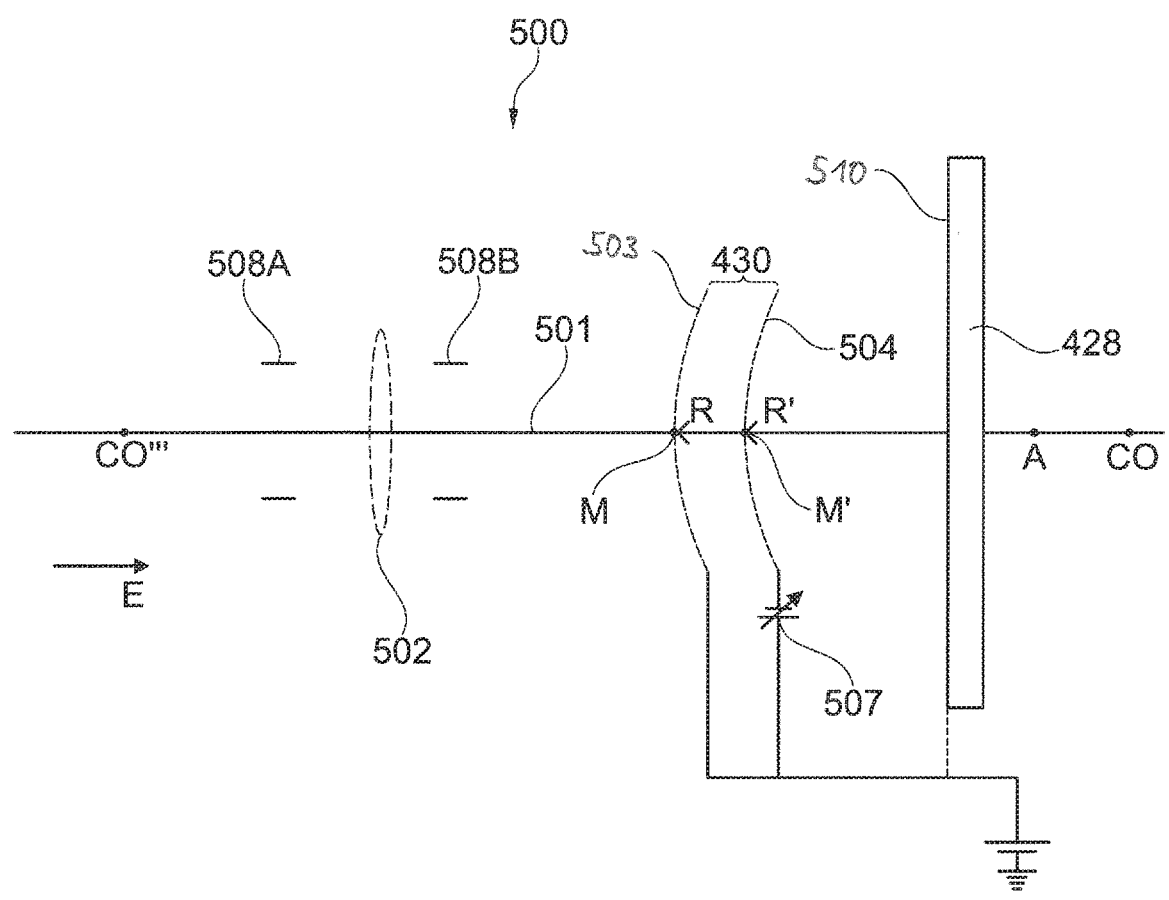
FIG. 10 shows a schematic illustration of a seventh embodiment of an analysis device for a particle beam apparatus according to the system described herein.

FIG. 10 shows a further embodiment of the analysis device 500. FIG. 10 is based on FIG. 9. Identical component parts are provided with the same reference signs. Therefore, reference is firstly made to the explanations given further above, which also apply to the embodiment in FIG. 9. In contrast to the embodiment in FIG. 9, in the embodiment in FIG. 10 the starting point A is arranged on the optical axis 501 downstream of the analysis detector 428 proceeding from the opposing field grid device 430 as viewed in the direction E of incidence of the interaction particles. In this exemplary embodiment, the crossover CO of the interaction particles is arranged on the optical axis 501 downstream of the starting point A proceeding from the opposing field grid device 430 as viewed in the direction E of incidence of the interaction particles. The crossover CO is then a virtual crossover. As an alternative thereto, another exemplary embodiment provides for arranging the crossover CO'" on the optical axis 501 proceeding from the electrostatic and/or magnetic lens 502 as viewed in a direction opposite to the direction E of incidence of the interaction particles. The crossover CO'" is then real. The exemplary embodiment in FIG. 10 furthermore also exhibits an electrostatic or magnetic stigmator 508A or an electrostatic or magnetic stigmator 508B. In this respect, reference is also made to the explanations further above.

The features of the invention disclosed in the present description, in the drawings and in the claims can be essential for the realization of the invention in the various embodiments thereof, both individually and in arbitrary combinations. The invention is not restricted to the described embodiments. It can be varied within the scope of the claims, taking into account the knowledge of the relevant person skilled in the art.

What is claimed is:

1. A particle beam apparatus for analyzing and/or processing an object, comprising:
    at least one beam generator for generating a particle beam comprising charged primary particles;
    at least one objective lens for focusing the particle beam onto the object, wherein interaction particles arise in the event of an interaction of the particle beam with the object; and
    at least one analysis device for analyzing the energy of charged particles in the form of the interaction particles, the analysis device having:
        at least one detector for detecting the charged particles, wherein the detector has a detection area on which impinge the charged particles which move in a direction of incidence toward the detector;
        at least one opposing field grid device to which a voltage is applied in such a way that a portion of the charged particles having an energy lower than a threshold energy is reflected by the opposing field grid device and not detected by the detector; and
        at least one electrostatic and/or magnetic lens, separate from the objective lens, wherein the electrostatic and/or magnetic lens is arranged between the objective lens and the opposing field grid device, wherein proceeding from the detector, as viewed in a direction opposite to the direction of incidence of the charged particles, firstly the detector, then the opposing field grid device and then the electrostatic and/or magnetic lens are arranged, wherein the opposing field grid device has a curvature, wherein the particle beam comprising the charged primary particles is not guided through the electrostatic and/or magnetic lens, and wherein the electrostatic and/or magnetic lens is excited in such a way that the charged particles having an energy higher than the threshold energy pass through an opposing field generated in the opposing field grid device parallel or substantially parallel to the opposing field;
        at least one optical axis which extends through the opposing field grid device;
        a center of curvature of the opposing field grid device at an intersection point of the optical axis with the opposing field grid device, and wherein the curvature has a radius of curvature which is a distance between the center of curvature and a starting point on the optical axis, wherein the analysis device has one of the following features:
  the electrostatic and/or magnetic lens is arranged along the optical axis downstream of the starting point as viewed in a direction of movement of the charged particles;
  the starting point is arranged along the optical axis between the electrostatic and/or magnetic lens and the center of curvature; or
  the starting point is arranged along the optical axis downstream of the electrostatic and/or magnetic lens and downstream of the center of curvature as viewed in a direction of movement of the charged particles.

2. The particle beam apparatus as claimed in claim 1, wherein the particle beam apparatus has one of the following features:
  at least one beam deflection and/or beam shaping device;
  at least one beam deflection and/or beam shaping device comprising at least one magnetic sector for deflecting the particle beam;
  at least one beam deflection and/or beam shaping device and at least one control unit for controlling a beam deflection and/or beam shaping device, wherein the control unit is configured in such a way that the beam deflection and/or beam shaping device is controlled depending on the voltage applied to the opposing field grid device; or
  at least one beam deflection and/or beam shaping device comprising at least one magnetic sector for deflecting the particle beam and comprising at least one control unit for controlling the magnetic sector, wherein the control unit is configured in such a way that the magnetic sector is controlled depending on the voltage applied to the opposing field grid device.

3. The particle beam apparatus as claimed in claim 1, wherein the particle beam apparatus has at least one mirror corrector for correcting chromatic and/or spherical aberration.

4. The particle beam apparatus as claimed in claim 1, wherein the particle beam apparatus is designed as an electron beam apparatus and/or as an ion beam apparatus.

5. The particle beam apparatus as claimed in claim 1, wherein the beam generator for generating a particle beam comprising charged primary particles is designed as a first beam generator for generating a first particle beam comprising first charged primary particles and the objective lens is designed as a first objective lens for focusing the first particle beam, and wherein the particle beam apparatus furthermore has:
  at least one second beam generator for generating a second particle beam comprising second charged primary particles, and
  at least one second objective lens for focusing the second particle beam onto the object.

6. The particle beam apparatus as claimed in claim 1, wherein the analysis device has the curvature curved in a direction opposite to the direction of incidence of the charged particles.

7. The particle beam apparatus as claimed in claim 1, wherein the electrostatic and/or magnetic lens is arranged at a non-zero distance from the objective lens along a detection beam path of the charged particles.

8. The particle beam apparatus as claimed in claim 1, wherein the electrostatic and/or magnetic lens guides charged particles that are far from the optical axis in a direction towards the optical axis.

9. The particle beam apparatus as claimed in claim 1, wherein the particle beam apparatus further comprises at least one beam deflection and/or beam shaping device, separate from the electrostatic and/or magnetic lens, arranged between the objective lens and the electrostatic and/or magnetic lens.

10. The particle beam apparatus as claimed in claim 1, wherein the analysis device has one of the following features:
  a crossover of the charged particles is arranged on the optical axis downstream of the starting point and upstream of the electrostatic and/or magnetic lens as viewed in the direction of movement of the charged particles;
  a crossover of the charged particles is arranged downstream of the starting point as viewed in the direction of movement of the charged particles, wherein the starting point is arranged downstream of the electrostatic and/or magnetic lens as viewed in the direction of movement of the charged particles; or
  a crossover of the charged particles is arranged upstream of the electrostatic and/or magnetic lens as viewed in the direction of movement of the charged particles, wherein the electrostatic and/or magnetic lens is arranged upstream of the starting point as viewed in the direction of movement of the charged particles.

11. The particle beam apparatus as claimed in claim 1, wherein the direction of movement is aligned parallel to the optical axis.

12. The particle beam apparatus as claimed in claim 1, wherein the analysis device has at least one of the following features:
  the opposing field grid device is designed in a spherical fashion; or
  the opposing field grid device is designed as a sphere segment.

13. The particle beam apparatus as claimed in claim 1, wherein the analysis device has the curvature curved in the direction of the direction of incidence of the charged particles.

14. The particle beam apparatus as claimed in claim 1, wherein the analysis device has one of the following features:
  the opposing field grid device has at least one first grid and at least one second grid; or
  the opposing field grid device has at least one first grid and at least one second grid, wherein the first grid is arranged concentrically with respect to the second grid, wherein the starting point is associated both with the first grid and with the second grid.

15. The particle beam apparatus as claimed in claim 1, wherein the analysis device has one of the following features:
  at least one stigmator, wherein proceeding from the detector, as viewed in a direction opposite to the direction of incidence of the charged particles, firstly the electrostatic and/or magnetic lens and then the stigmator are arranged;
  at least one stigmator, wherein proceeding from the detector, as viewed in a direction opposite to the direction of incidence of the charged particles, firstly the electrostatic and/or magnetic lens and then the stigmator are arranged, wherein the electrostatic and/or magnetic lens has a minimum focal length, and wherein a distance between the stigmator and the electrostatic and/or magnetic lens maximally corresponds to the minimum focal length;

at least one stigmator, wherein proceeding from the detector, as viewed in a direction opposite to the direction of incidence of the charged particles, firstly the stigmator and then the electrostatic and/or magnetic lens are arranged;

at least one stigmator, wherein proceeding from the detector, as viewed in a direction opposite to the direction of incidence of the charged particles, firstly the stigmator and then the electrostatic and/or magnetic lens are arranged, wherein the electrostatic and/or magnetic lens has a minimum focal length, and wherein a distance between the stigmator and the electrostatic and/or magnetic lens maximally corresponds to the minimum focal length; or at least one stigmator designed with the electrostatic and/or magnetic lens as an individual optical unit.

16. The particle beam apparatus as claimed in claim 15, wherein the stigmator is of magnetic or electrostatic design.

17. The particle beam apparatus as claimed in claim 1, wherein the analysis device has a control device for controlling the excitation of the electrostatic and/or magnetic lens and wherein the control device is configured in such a way that the excitation of the electrostatic and/or magnetic lens is controlled depending on the voltage applied to the opposing field grid device.

* * * * *